US011955541B2

(12) United States Patent
Chen et al.

(10) Patent No.: US 11,955,541 B2
(45) Date of Patent: Apr. 9, 2024

(54) SEMICONDUCTOR DEVICE AND METHOD FOR FORMING THE SAME

(71) Applicant: UNITED MICROELECTRONICS CORP., Hsin-Chu (TW)

(72) Inventors: Chi-Hsiao Chen, Chiayi (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 290 days.

(21) Appl. No.: 17/335,026

(22) Filed: May 31, 2021

(65) Prior Publication Data
US 2022/0336650 A1  Oct. 20, 2022

(30) Foreign Application Priority Data

Apr. 20, 2021  (CN) .......................... 202110423761.8

(51) Int. Cl.
| | |
|---|---|
| *H01L 29/778* | (2006.01) |
| *H01L 29/06* | (2006.01) |
| *H01L 29/20* | (2006.01) |
| *H01L 29/66* | (2006.01) |

(52) U.S. Cl.
CPC ...... *H01L 29/7786* (2013.01); *H01L 29/0642* (2013.01); *H01L 29/2003* (2013.01); *H01L 29/66462* (2013.01)

(58) Field of Classification Search
CPC ............. H01L 29/7786; H01L 29/0642; H01L 29/2003; H01L 29/66462; H01L 21/2654; H01L 21/7605; H01L 21/823481; H01L 21/8252; H01L 29/41766; H01L 27/0605; H01L 27/085; H01L 29/1066; H01L 29/66431; H01L 29/0649; H01L 29/7782; H01L 29/778–7789; H01L 2924/13064; H01L 29/122–127; H01L 29/15–158
See application file for complete search history.

(56) References Cited

U.S. PATENT DOCUMENTS

| | | | |
|---|---|---|---|
| 8,242,539 B2 | 8/2012 | Ohmaki | |
| 8,723,228 B1 | 5/2014 | Oh | |
| 2011/0037101 A1* | 2/2011 | Nakazawa | H01L 29/207 257/E29.091 |
| 2013/0161780 A1* | 6/2013 | Kizilyalli | H01L 29/2003 257/E21.09 |
| 2021/0134957 A1* | 5/2021 | Hsu | H01L 29/151 |
| 2022/0052166 A1* | 2/2022 | Yeh | H01L 29/66462 |
| 2022/0254902 A1* | 8/2022 | Okita | H01L 29/66431 |

* cited by examiner

*Primary Examiner* — Jonathan Han
(74) *Attorney, Agent, or Firm* — Winston Hsu

(57) ABSTRACT

A semiconductor device includes a substrate, a buffer layer disposed on the substrate, a channel layer disposed on the buffer layer, a barrier layer disposed on the buffer layer, and a passivation layer disposed on the barrier layer. The semiconductor device further includes a device isolation region that extends through the passivation layer, the barrier layer, and at least a portion of the channel layer, and encloses a first device region of the semiconductor device. A damage concentration of the device isolation region varies along a depth direction, and is highest near a junction between the barrier layer and the channel layer.

8 Claims, 10 Drawing Sheets

SEMICONDUCTOR DEVICE AND METHOD FOR FORMING THE SAME

BACKGROUND OF THE INVENTION

1. Field of the Invention

The present invention relates to a semiconductor device and method for forming the same. More particularly, the present invention relates to a high electron mobility transistor (HEMT) including a device isolation region and method for forming the same.

2. Description of the Prior Art

A high electron mobility transistor (HEMT) is a new type of field effect transistor which usually includes a heterostructure including stacked semiconductor layers. By bonding semiconductor layers having different band gaps, the energy band near the heterojunction between the semiconductor layers may bend to form a potential well. The free electrons may converge into the potential well thereby forming a two-dimensional electron gas (2DEG) layer near the heterojunction. The two-dimensional electron gas layer may be utilized as a current channel region of the HEMT, and may achieve high switching speed and high response frequency. HEMTs have been widely used in technical fields such as power converters, low noise amplifiers, radio frequency (RF) or millimeter wave (MMW).

Numerous efforts have been made to optimize the design of the HEMTs to provide a HEMT having higher breakdown voltage, higher output power, lower power consumption through a more simplified manufacturing process. It is known that leakage current of a HEMT is one of the important factors affecting the performance. How to design the device isolation region of the HEMT is an important subject in the field.

SUMMARY OF THE INVENTION

In light of the above, the present invention is directed to provide a semiconductor device, and a method for forming the same. Particularly, the semiconductor device provided by the present invention includes a device isolation region formed by ion implantation process. The ion implantation process implants ions into the stacked epitaxial layers of the semiconductor device to damage the lattice structures of the stacked epitaxial layers, thereby forming a high damage concentration region in the stacked epitaxial layers. The high damage concentration region may provide the function of electrical isolation by restricting or trapping the free electrons, so that the leakage current may be inhibited or blocked. Furthermore, the present invention using ion implantation process to form a high damage concentration region to be a device isolation region of the semiconductor device may have a simplified manufacturing process.

According to one embodiment of the present invention, a semiconductor device is disclosed. The semiconductor device includes a substrate, a buffer layer disposed on the substrate, a channel layer disposed on the buffer layer, a barrier layer disposed on the buffer layer, a passivation layer disposed on the barrier layer, and a device isolation region enclosing a first device region of the semiconductor device and extending through the passivation layer and the barrier layer and into at least a portion of the channel layer. A damage concentration of the device isolation region varies along a depth direction, and a highest damage concentration is near a junction between the barrier layer and the channel layer.

According to another embodiment of the present invention, a method for forming a semiconductor device is disclosed and includes the steps of providing a substrate, forming a buffer layer on the substrate, forming a channel layer on the buffer layer, forming a barrier layer on the buffer layer, forming a passivation layer on the barrier layer, and performing an ion implantation process to form a device isolation region. The device isolation region encloses a first device region of the semiconductor device and extends through the passivation layer and the barrier layer and into at least a portion of the channel layer, a damage concentration of the device isolation region varies along a depth direction, and a highest damage concentration is near a junction between the barrier layer and the channel layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
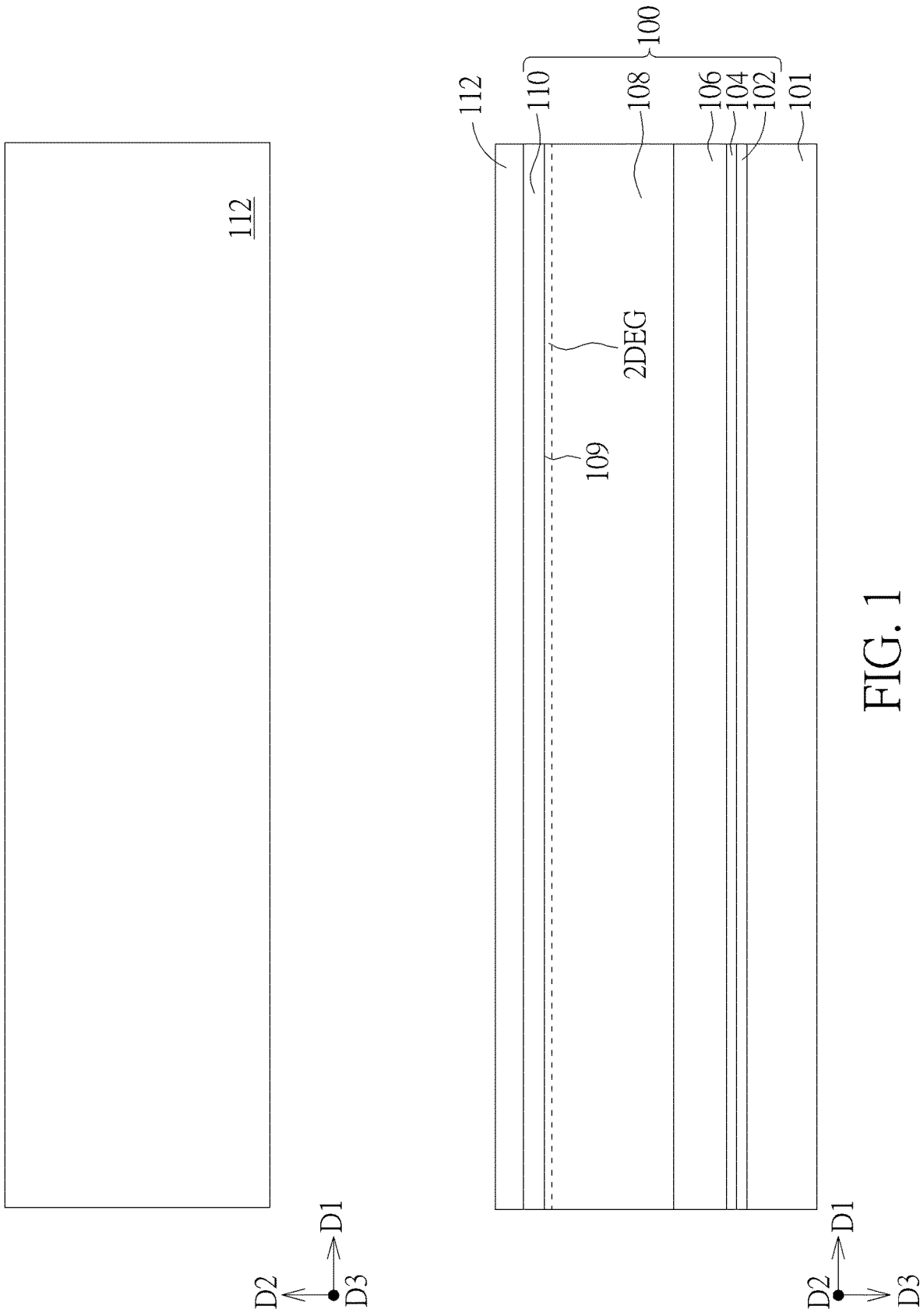
FIG. 1 to FIG. 7 are schematic diagrams illustrating the steps of a method for forming a semiconductor device according to one embodiment of the present invention. The upper portions of the diagrams are top views of the semiconductor device. The lower portions of the diagrams are cross-sectional views of the semiconductor device.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

The semiconductor device provided by the present invention may be a high electron mobility transistor (HEMT), and may be a depletion mode (normally-on) HEMT or an enhancement mode (normally-off) HEMT. The semiconductor device provided by the present invention may be used in power converters, low noise amplifiers, radio frequency (RF), millimeter wave (MMW), or other technical fields.

The gate, source, and drain structures of the semiconductor device shown in the embodiments of the present invention are examples and are not intended to limit the present invention. A semiconductor device (HEMT) including a metal-semiconductor gate structure is taken as an example in the following description. It should be understood that the present invention may also be applied to semiconductor devices including metal gate structures.

FIG. 1 to FIG. 7 are schematic diagrams illustrating the steps of a method for forming a semiconductor device according to one embodiment of the present invention. The upper portions of the diagrams are top views of the semiconductor device in the plane defined by the first direction D1 and the second direction D2. The lower portions of the diagrams are cross-sectional views of the semiconductor device in the plane defined by the first direction D1 and the third direction D3.

The semiconductor device provided by the present invention may be a HEMT, and may be formed by the following steps. First, as shown in FIG. 1, a substrate 101 is provided. An epitaxial layer stack 100 is formed on the substrate 101. According to an embodiment of the present invention, the epitaxial layer stack 100 may be formed by forming (from bottom to top, or from the portion closer to the substrate 101 to the portion away from the substrate 101) a nucleation layer 102, a transition layer 104, a buffer layer 106, a channel layer 108, and a barrier layer 110. After that, a semiconductor gate layer 112 may be formed on the barrier layer 110.

The substrate 101 may include a silicon substrate, a silicon carbide (SiC) substrate, a sapphire substrate, a gallium nitride substrate, an aluminum nitride substrate, or a substrate made of other suitable materials. The nucleation layer 102, the transition layer 104, the buffer layer 106, the channel layer 108, and the barrier layer 110 may respectively include a group III-V compound semiconductor material, such as gallium nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but is not limited thereto. According to an embodiment of the present invention, the nucleation layer 102 may include aluminum nitride (AlN), the transition layer 104 may include aluminum gallium nitride (AlGaN) or gallium nitride (GaN), the buffer layer 106 may include carbon-doped gallium nitride (GaN:C), the channel layer 108 may include gallium nitride (GaN), and the barrier layer 110 may include aluminum gallium nitride (AlGaN), but are not limited thereto.

By selecting appropriate materials of the channel layer 108 and the barrier layer 110, the energy band near the junction 109 between the channel layer 108 and the barrier layer 110 may bend to form a potential well. The spontaneous polarization and piezoelectric polarization effects of the channel layer 108 may generate a high concentration of electrons converging into the potential well, thereby forming a two-dimensional electron gas layer 2DEG near the surface of the channel layer 108. The two-dimensional electron gas layer 2DEG may be a planar current channel region of the semiconductor device at on-state.

The material of the semiconductor gate layer 112 may include a group III-V compound semiconductor material, and may have an n-type conductivity (negative conductive type) or a p-type conductivity (positive conductive type) according to the application needs of the semiconductor device. The semiconductor gate layer 112 uses its built-in voltage to pull up the energy band and of the potential well and deplete the two-dimensional electron gas layer 2DEG approximately directly below the semiconductor gate layer 112, so that a normally-off operation of the semiconductor device may be achieved when no gate voltage is applied. According to an embodiment of the present invention, the semiconductor gate layer 112 may include p-type gallium nitride (p-GaN) having dopants such as magnesium (Mg), iron (Fe) or other suitable p-type dopants, but is not limited thereto.

According to an embodiment of the present invention, the epitaxial layer stack 100 may be formed on the substrate 101 through a heteroepitaxy growth process. The heteroepitaxy growth process may include molecule beam epitaxy (MBE), metal-organic chemical vapor deposition (MOCVD), or hydride vapor phase deposition (HVPE), but is not limited thereto.

According to an embodiment of the present invention, the buffer layer 106, the channel layer 108, and the barrier layer 110 may respectively be single layered, or may respectively have a superlattice structure including multiple semiconductor thin layers. By selecting the materials and adjusting the thicknesses of the semiconductor thin layers, the band structure, the strength of the polarization field, and/or the carrier distribution in the epitaxial layer stack 100 may be adjusted to so that the carrier distribution and carrier mobility of the two-dimensional electron gas layer 2DEG may be optimized to achieve the expected performance.

Figure 2:
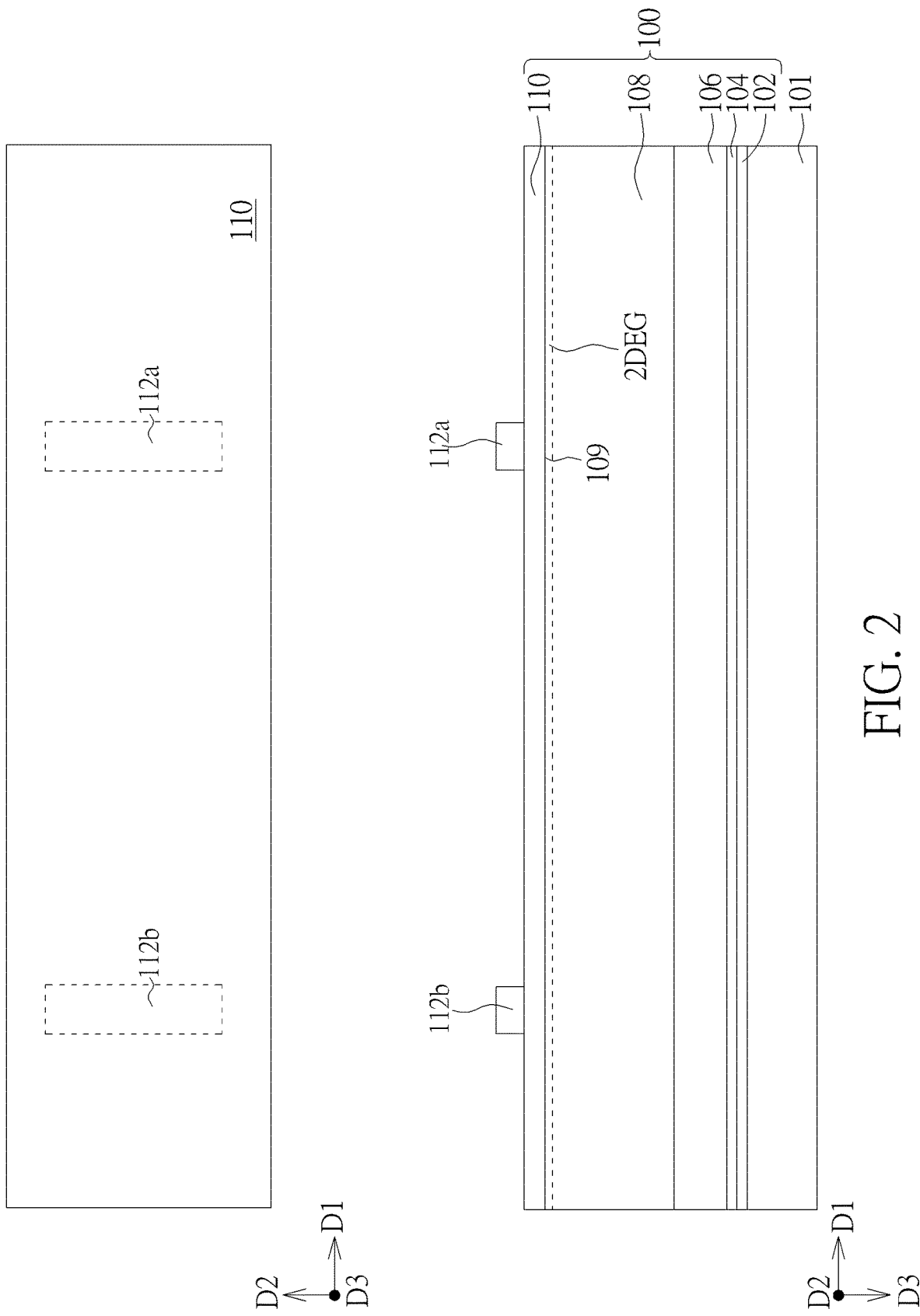

Please refer to FIG. 2. Subsequently, a patterning process may be performed to the semiconductor gate layer 112 to form a first semiconductor gate layer 112a and a second semiconductor gate layer 112b.

Figure 3:
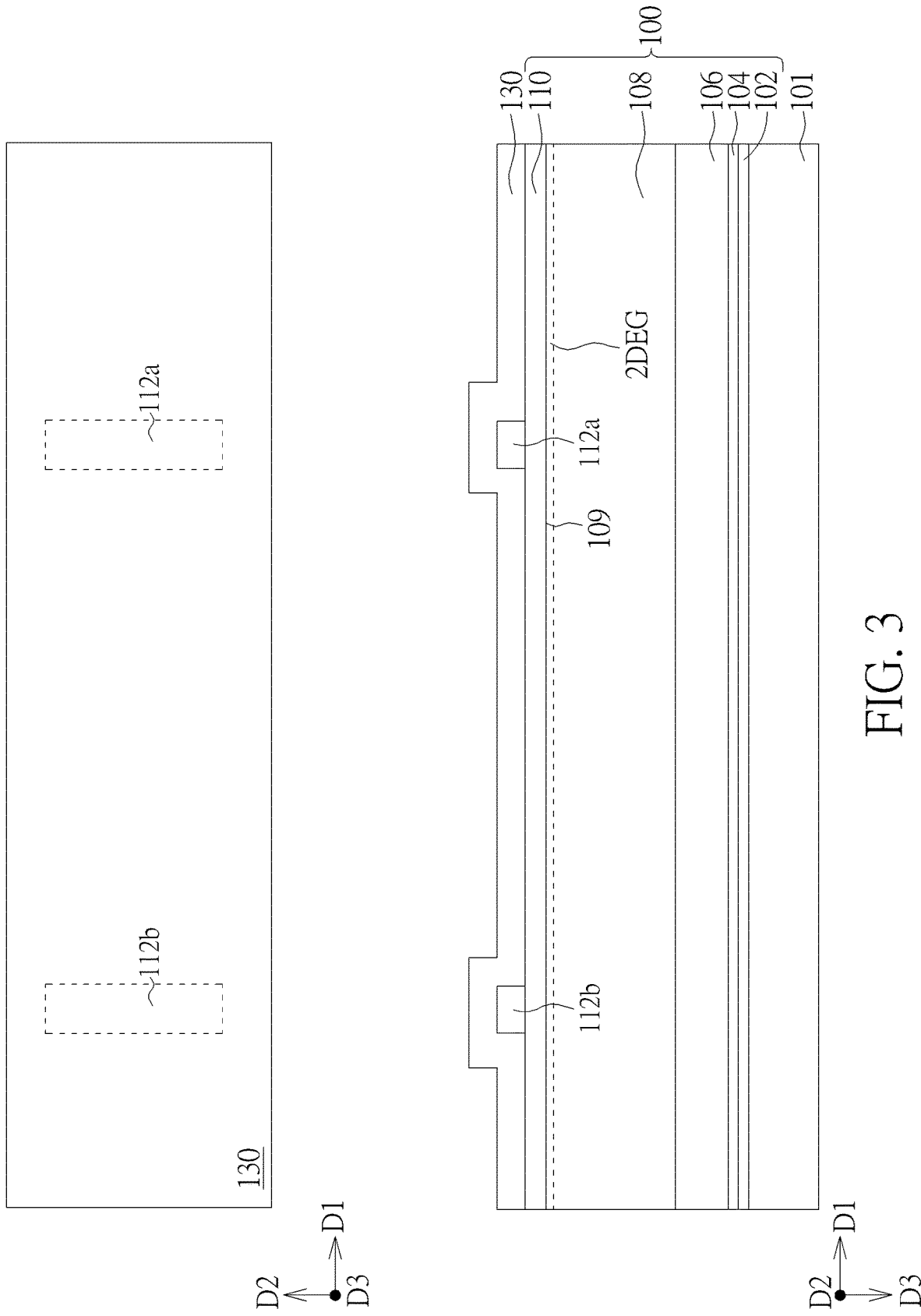

Please refer to FIG. 3. Subsequently, a passivation layer 130 is formed on the barrier layer 110 and covers the first semiconductor gate layer 112a and the second semiconductor gate layer 112b. The passivation layer 130 may include a single layer or multiple layers made of at least a dielectric material, such as aluminum nitride (AlN), aluminum oxide ($Al_2O_3$), boron nitride (BN), silicon nitride ($Si_3N_4$), silicon oxide (SiO$_2$), zirconia (ZrO$_2$), hafnium oxide (HfO$_2$), lanthanum oxide (La$_2$O$_3$), lutetium oxide (Lu$_2$O$_3$), lanthanum oxide (LaLuO$_3$), high-k dielectric materials, other suitable dielectric materials, or a combination thereof, but is not limited thereto. The passivation layer 130 may be formed by atomic layer deposition (ALD), plasma enhanced atomic layer deposition (PEALD), chemical vapor deposition (CVD), plasma enhanced chemical vapor deposition (PECVD), and low pressure chemical vapor deposition (LPCVD), but is not limited thereto. The passivation layer 130 may provide electrical isolation and also protects the underneath material layers from being damaged during the subsequent manufacturing process.

Figure 4:
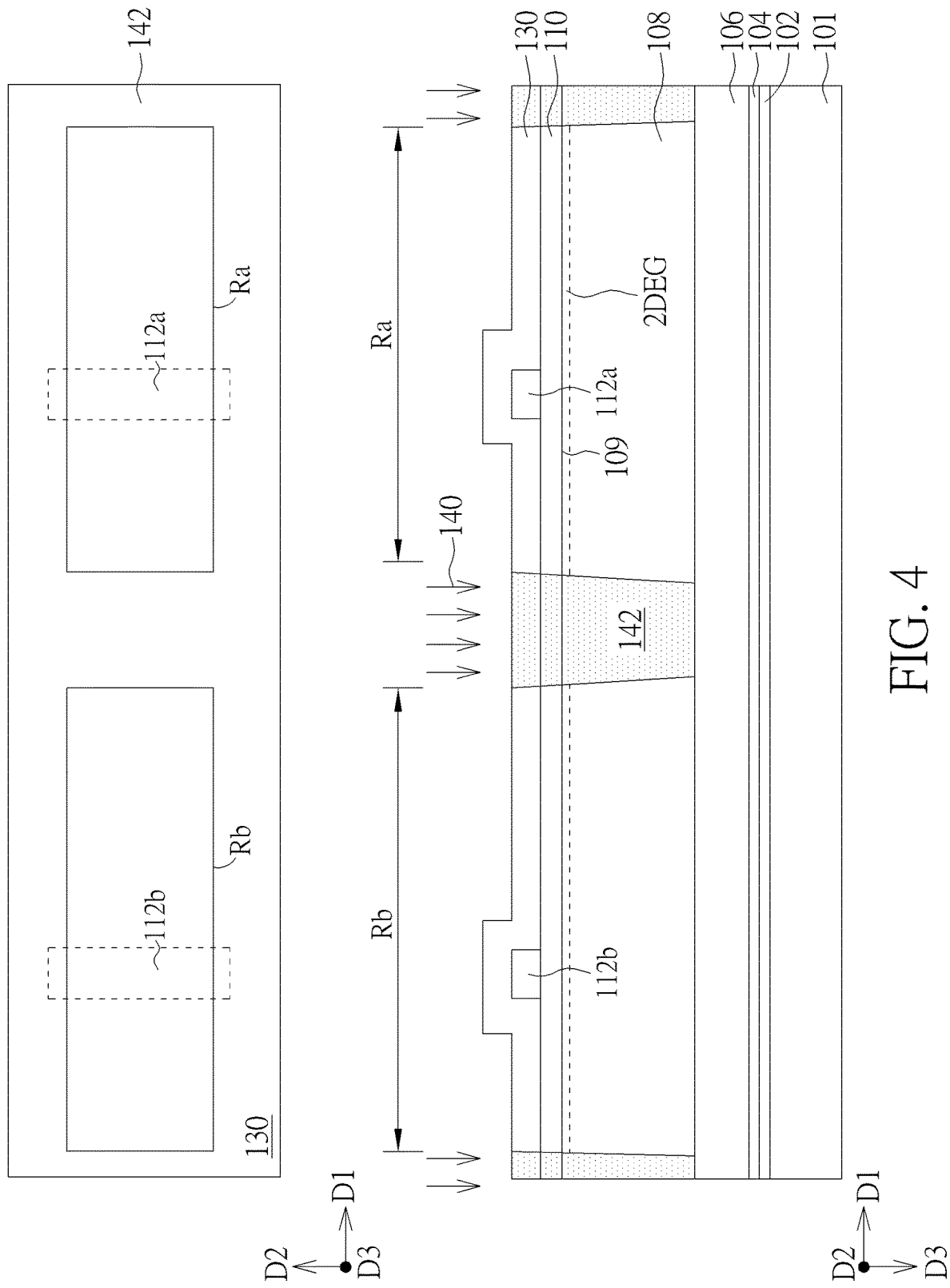

Please refer to FIG. 4. After forming a patterned mask (not shown) on the passivation layer 130, subsequently, an ion implantation process 140 using the patterned mask (not shown) as an implanting mask may be carried out to implant ions into the passivation layer 130, the barrier layer 110, and at least a portion of the channel layer 108 to damage the lattice structures of the implanted regions, thereby forming a device isolation region 142 of the semiconductor device. The device isolation region 142 encloses a first device region Ra and a second device region Rb of the semiconductor device and extends through the passivation layer 130 and the barrier layer 110 and into at least a portion of the channel layer 108 along the third direction D3 (the depth direction). According to an embodiment of the present invention, the ions used in the ion implantation process 140 may include at least a species selected from a group comprising argon (Ar), fluorine (F), nitrogen (N), boron (B), indium (In), and germanium (Ge), but is not limited thereto. According to an embodiment of the present invention, when the lattice structures of the device isolation region 142 are highly damaged, the device isolation region 142 may be an amorphous region.

The lattice damages of the device isolation region 142 may restrict or trap the free electrons and reduce the concentration of free electrons. When the damage concentration of the device isolation region 142 is higher than the free electron concentration of the two-dimensional electron gas layer 2DEG the free electrons of the portion of the two-dimensional electron gas layer 2DEG overlapping the device isolation region 142 may be restricted or trapped by the lattice damages, so that the two-dimensional electron gas layer 2DEG may be discontinued by the device isolation region 142, and the electrical isolation between the first device region Ra and the second device region Rb may be achieved. According to an embodiment of the present invention, the ion implantation process 140 may implant species of ions which are able to form charged centers in the device isolation region 142. The charged centers may scatter the free electrons and reduce the mobility of the free electrons, so that the electrical isolation function of the device isolation region 142 may be further enhanced.

To ensure the electrical isolation between the first device region Ra and the second device region Rb, preferably, the device isolation region 142 may extend through the whole thickness of the channel layer 108 until directly contacting the buffer layer 106. In this way, when the buffer layer 106 is made of a high resistance material (such as GaN:C) with a low conductivity, the buffer layer 106 and the device isolation region 142 may collectively form an isolation structure that completely encompasses the bottom portion of the first device region Ra and the second device region Rb. In the embodiment as shown in FIG. 4, the bottom surface of the device isolation region 142 may flush with an interface between the channel layer 108 and the buffer layer 106.

It should be noted that, in FIG. 4, the first semiconductor gate layer 112a and the second semiconductor gate layer 112b traversing the first device region Ra and the second device region Rb, respectively, and having terminals slightly projecting beyond the edges of the first device region Ra and the second device region Rb and overlapping a portion of the device isolation region 142 are only examples and are not intended to limit the present invention. In some embodiments of the present invention, the terminals of the first semiconductor gate layer 112a and the second semiconductor gate layer 112b may be approximately flush with the edges of the first device region Ra and the second device region Rb and do not overlap the device isolation region 142. In some embodiments of the present invention, the terminals of the first semiconductor gate layer 112a and the second semiconductor gate layer 112b may be disposed completely within the first device region Ra and the second device region Rb and do not overlap the edges of the first device region Ra and the second device region Rb and the device isolation region 142.

One feature of the present invention is that, by adjusting the process parameters such as implanting angle, dosage, and energy of the ion implantation process 140, the device isolation region 142 may have a damage concentration varying along the third direction D3 (the depth direction). According to an embodiment of the present invention, the ions implanted by the ion implantation process 140 may include argon (Ar) ions, the implanting angle may be between 0 and 10 degrees with respect to the third direction D3 (the depth direction), the implanting dosage may be between 1E12 atoms/cm$^2$ and 1E15 atoms/cm$^2$, and the implanting energy may be between 50 KeV and 150 KeV, but are not limited thereto.

According to an embodiment of the present invention, the ion implantation process 140 may include multiple implanting steps to obtain a desired damage concentration profile. For example, a higher energy implanting step (implanting energy between 100 KeV and 150 KeV) may be carried out to implant argon ions into the portion of the device isolation region 142 between the junction 109 and the channel layer 108, and a lower energy implanting step (implanting energy between 50 KeV and 90 KeV) may be carried out to implant argon ions into the portion of the device isolation region 142 near the junction 109.

Figure 10:
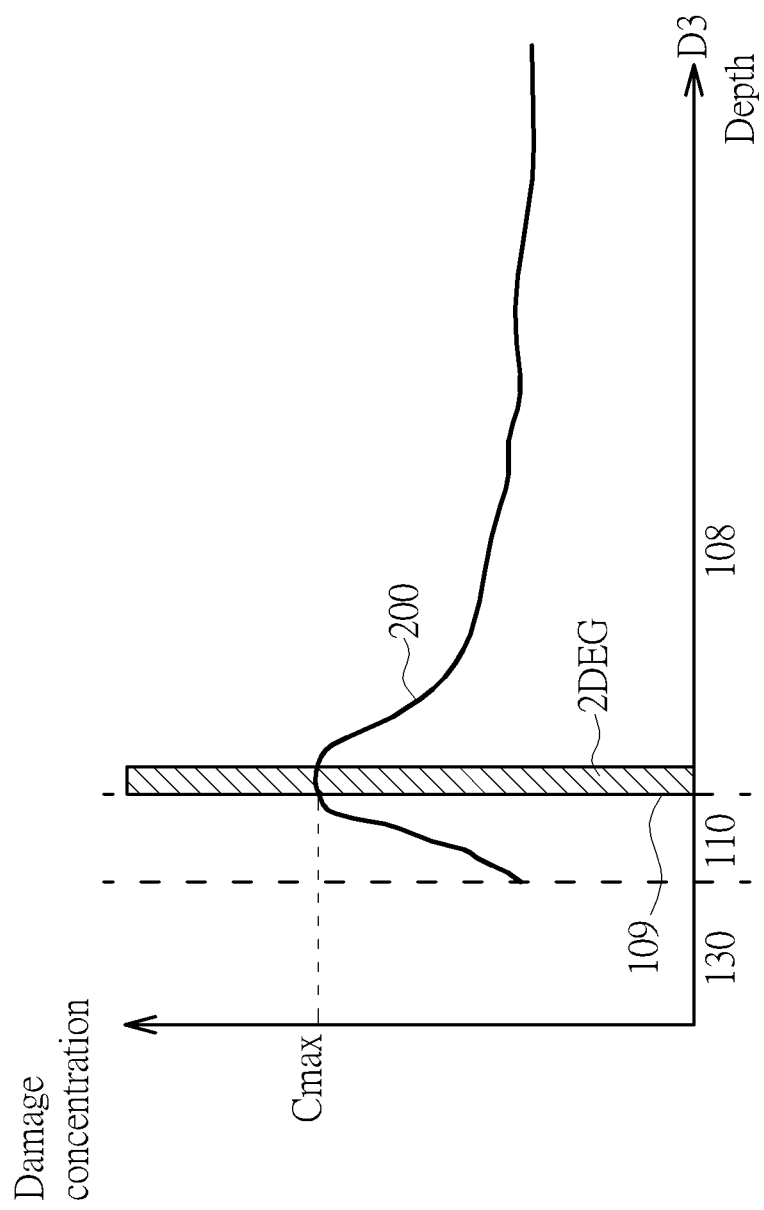
FIG. 10 shows a damage concentration curve of the device isolation region along a depth direction (the third direction) according to an embodiment of the present invention.

Please refer to FIG. 10, which show a damage concentration curve 200 of the device isolation region 142 along the third direction D3 (the depth direction) according to an embodiment of the present invention. For the sake of understanding, the positions of the passivation layer 130, the barrier layer 110, the channel layer 108, the junction 109, and the two-dimensional electron gas layer 2DEG along the third direction D3 (the depth direction) are also shown in FIG. 10. It is noticeable that the device isolation region 142 has a highest damage concentration Cmax near the junction 109 and the two-dimensional electron gas layer 2DEG between the channel layer 108 and the barrier layer 110. The damage concentration Cmax is at least equal to or preferably larger than the concentration of the free electrons of the two-dimensional electron gas layer 2DEG According to an embodiment of the present invention, the free electron concentration of the two-dimensional electron gas layer 2DEG may be approximately 9E19 count/cm$^3$, and the damage concentration Cmax of the device isolation region 142 may be approximately 2E20 count/cm$^3$.

Figure 5:
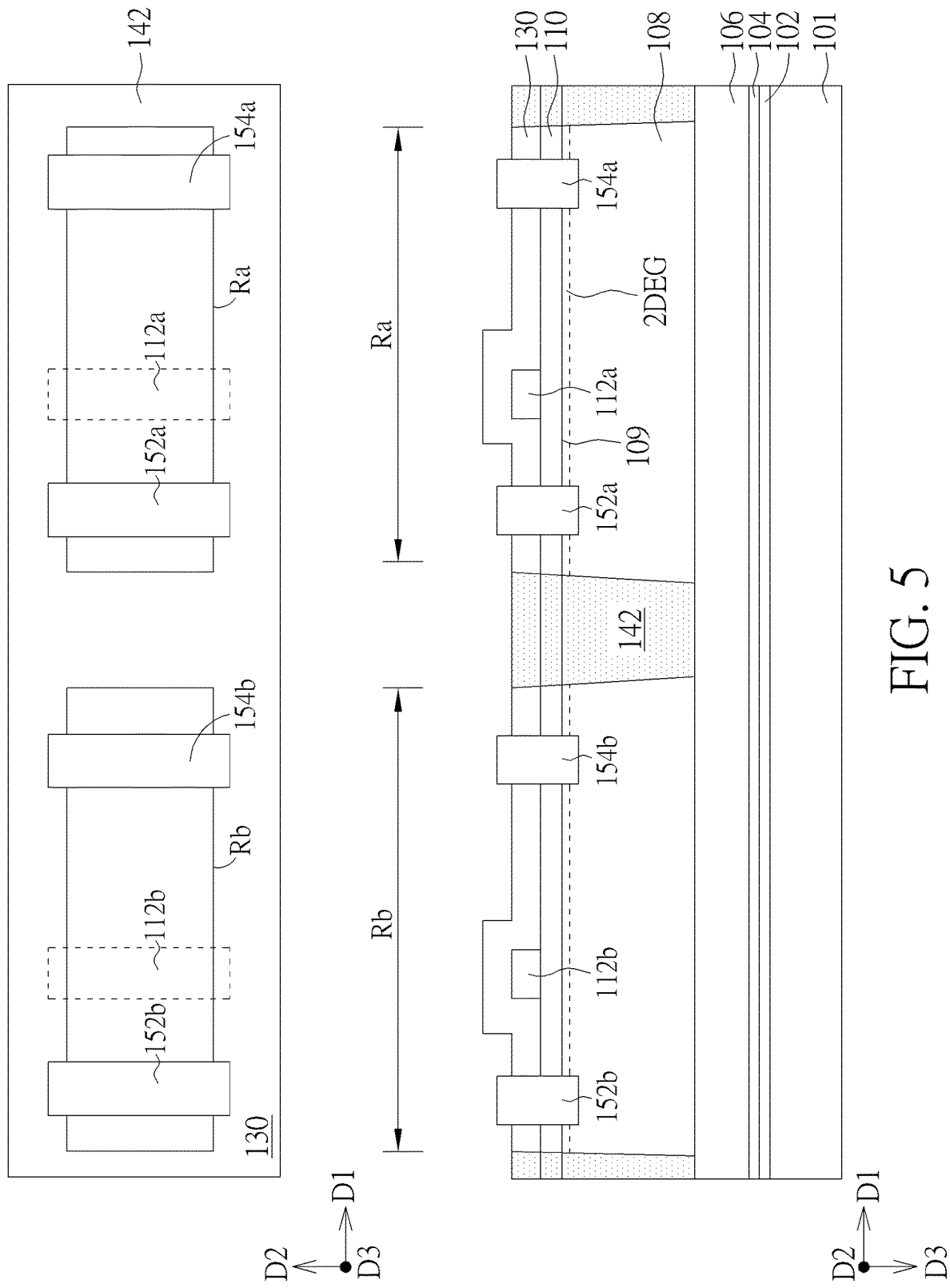

Please refer to FIG. 5. Subsequently, a first drain contact 152a and a first source contact 154a are formed at two sides of the first semiconductor gate layer 112a, and a second drain contact 152b and a second source contact 154b are formed at two sides of the second semiconductor gate layer 112b. The first drain contact 152a, the first source contact 154a, the second drain contact 152b, and the second source contact 154b may be formed by any suitable process. For example, a photolithography-etching process may be performed to form openings that extend through the passivation layer 130 and the barrier layer 110 and into an upper portion of the channel layer 108, and then a deposition process such as an electron beam evaporation process or a sputtering may be performed to form a conductive layer on the passivation layer 130 and filling the openings. Afterward, a patterning process such as a lift-off process or a photolithography-etching process may be performed to remove unnecessary portions of the conductive layer, thereby obtaining the first drain contact 152a, the first source contact 154a, the second drain contact 152b, and the second source contact 154b as shown in FIG. 5. The material of the first drain contact 152a, the first source contact 154a, the second drain contact 152b, and the second source contact 154b may respectively include metals such as gold (Au), tungsten (W), cobalt (Co), nickel (Ni), titanium (Ti), molybdenum (Mo), copper (Cu), aluminum (Al), tantalum (Ta), Palladium (Pd), platinum (Pt), a compound of the above materials, a composite layer of the above materials, or an alloy of the above materials, but is not limited thereto.

It should be noted that the first drain contact 152a, the first source contact 154a, the second drain contact 152b, and the second source contact 154b shown in FIG. 5 traversing the first device region Ra and the second device region Rb, respectively, have terminals slightly projecting beyond the edges of the first device region Ra and the second device region Rb, and overlapping a portion of the device isolation region 142 are only examples and are not intended to limit the present invention. In some embodiments of the present invention, the terminals of the first source contact 154a, the second drain contact 152b, and the second source contact 154b may be approximately flush with the edges of the first device region Ra and the second device region Rb and do not overlap the device isolation region 142. In some embodiments of the present invention, the terminals of the first source contact 154a, the second drain contact 152b, and the second source contact 154b may be completely within the first device region Ra and the second device region Rb and do not overlap the edges of the first device region Ra and the second device region Rb and the device isolation region 142.

Figure 6:
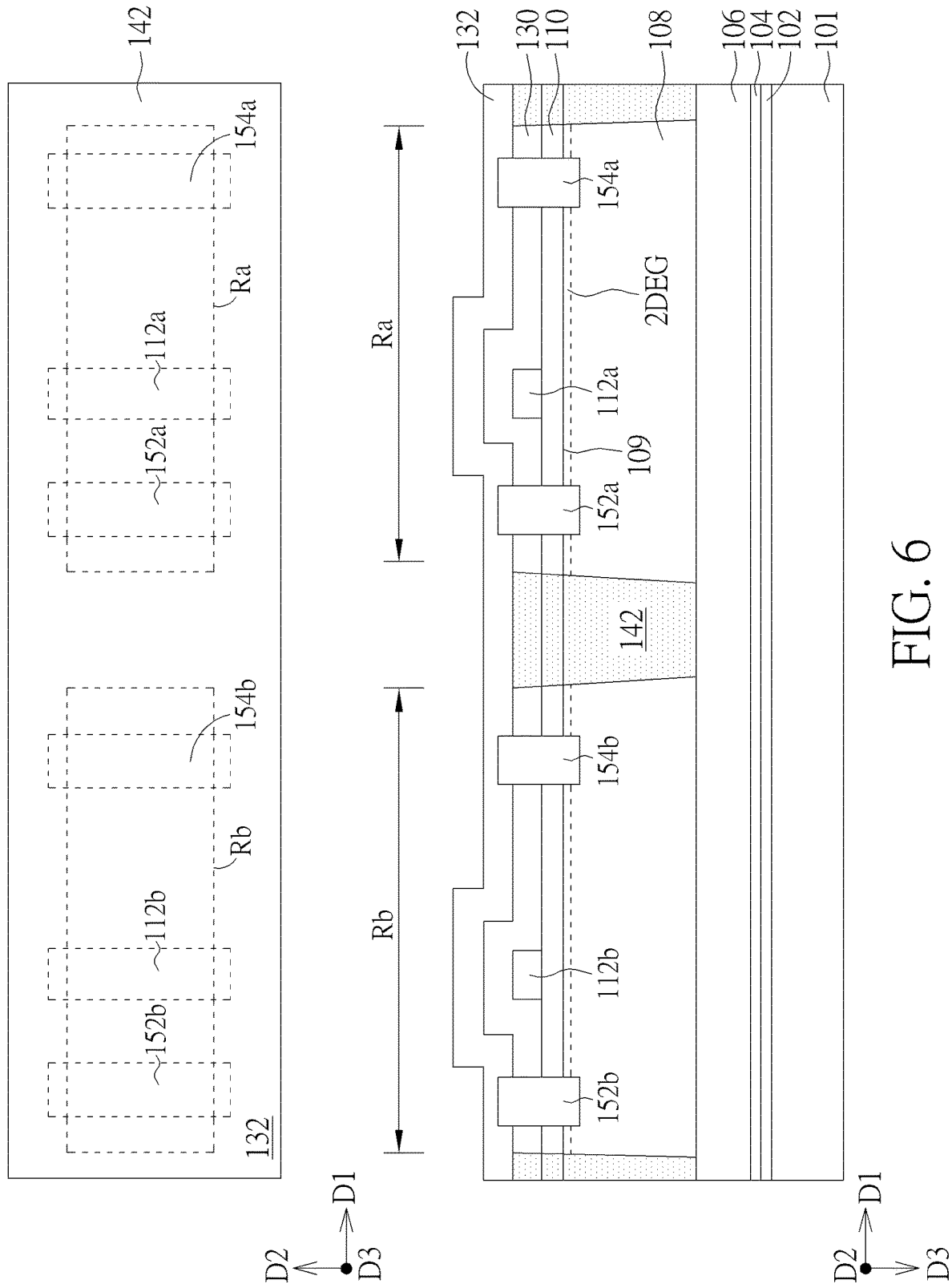

Please refer to FIG. 6. Subsequently, another passivation layer 132 is formed and covers the passivation layer 130, the first drain contact 152a, the first source contact 154a, the second drain contact 152b, and the second source contact 154b in a blanket manner. The passivation layer 132 may include a single layer or multiple layers made of at least a dielectric material selected from the dielectric materials suitable for the passivation layer 130. The passivation layer 130 and the passivation layer 132 may include the same or different dielectric materials.

Figure 7:
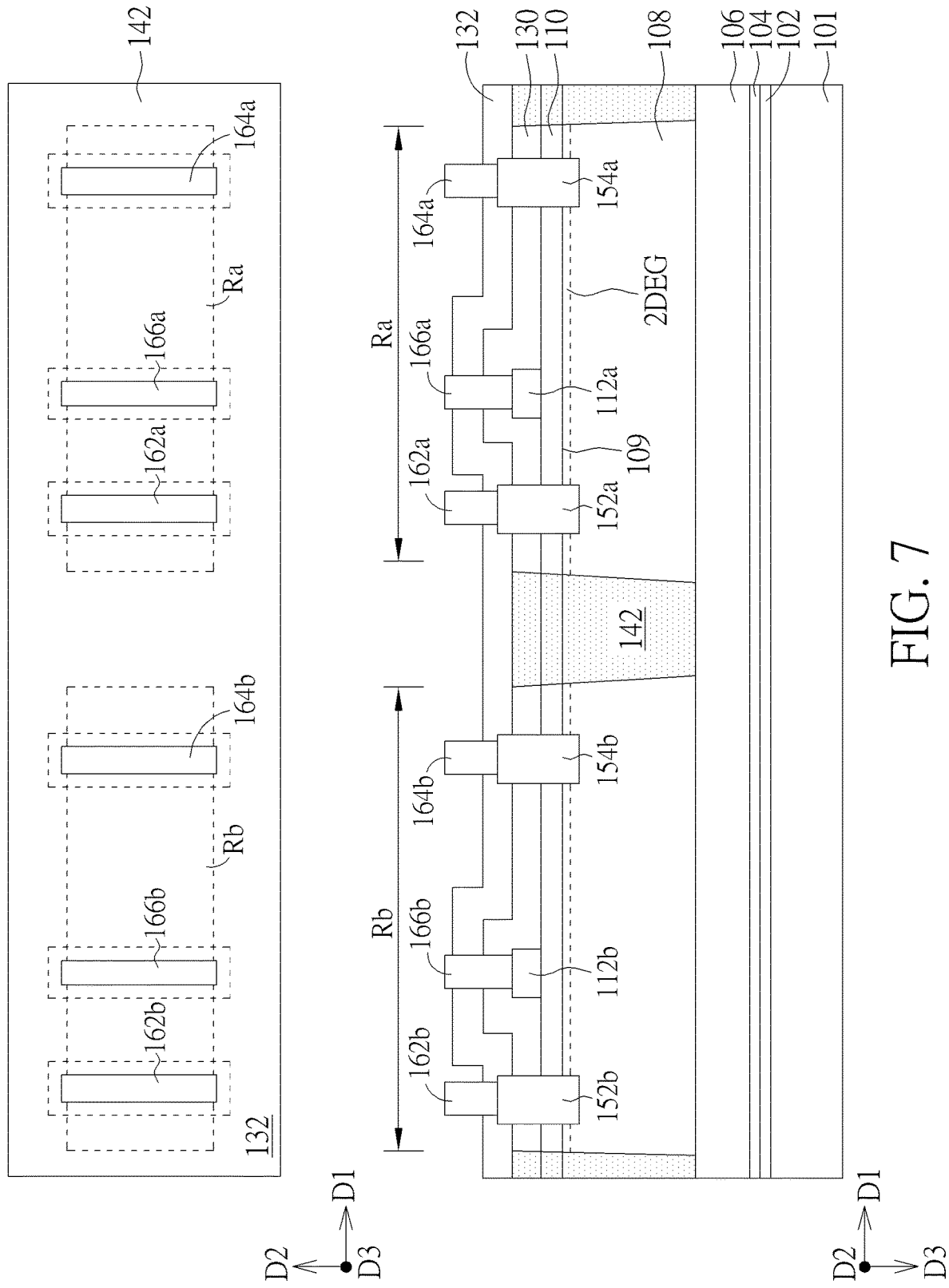

Please refer to FIG. 7. Subsequently, a first gate electrode 166a, a first drain electrode 162a, and a first source electrode 164a are formed on the first device region Ra and penetrate through the passivation layer 132 to contact the first semiconductor layer 112a, the first drain contact 162a, and the first source contact 154a, respectively. A second gate electrode 166b, a second drain electrode 162b, and a second drain electrode 164b are formed on the second device region Rb and penetrate through the passivation layer 132 to contact the second semiconductor layer 112b, the second drain contact 162b, and the second source contact 154b, respectively. The material of the first gate electrode 166a, the first drain electrode 162a, the first source electrode 164a, the second gate electrode 166b, the second drain electrode 162b, and the second drain electrode 164b may include metals such as gold (Au), tungsten (W), cobalt (Co), nickel (Ni), titanium (Ti), molybdenum (Mo), copper (Cu), aluminum (Al), tantalum (Ta), Palladium (Pd), platinum (Pt), a compound of the above materials, a composite layer of the above materials, or an alloy of the above materials, but is not limited thereto. It should be understood that the patterns of the first gate electrode 166a, the first drain electrode 162a, the first source electrode 164a, the second gate electrode 166b, the second drain electrode 162b, and the second drain electrode 164b shown in FIG. 7 are only examples, and may be adjusted according to design needs.

It should be noted that the sequence of the process steps for forming the first drain contact 152a, the first source contact 154a, the second drain contact 152b, the second source contact 154b, the first gate electrode 166a, the first drain electrode 162a, the first source electrode 164a, the second gate electrode 166b, the second drain electrode 162b, and the second source electrode 164b illustrated previously are examples, and may be changed in other embodiments of the present invention. In some embodiments, after forming the device isolation region 142, the first gate electrode 166a, the second gate electrode 166b, the first drain contact 152a and the first source contact 154a that are at two sides of the first gate electrode 166a, and the second drain contact 152b and the second source contact 154b that are at two sides of the second gate electrode 166b may be formed on the epitaxial layer stack 100 and through the passivation layer 130 at the same time through the same manufacturing steps. In this way, the interconnecting structures (not shown) formed in subsequent process may directly contact and electrically connected the portions of the first drain contact 152a, the first source contact 154a, the second drain contact 152b, and the second source contact 154b exposed from the passivation layer 130, such that the passivation layer 132, the first drain electrode 162a, the first source electrode 164a, the second drain electrode 162b, and the second drain electrode 164b may be omitted. Other process sequences not mentioned in the specification may be applied to form the semiconductor device of the present invention as long as the drain contact and the source contact may contact the two-dimensional electron gas layer, the gate electrode may contact the semiconductor gate layer, and the drain contact, the source contact, and the gate electrode may be electrically connected to the interconnecting structures (not shown) formed in subsequent process for operating the semiconductor device.

Please continue to refer to FIG. 7 and FIG. 10. The semiconductor device provided by the present invention includes a substrate 101, a buffer layer 106 disposed on the substrate 101, a channel layer 108 disposed on the buffer layer 106, a barrier layer 110 disposed on the channel layer 108, and a passivation layer 130 disposed on the barrier layer 110. The semiconductor device further includes a device isolation region 142 that encloses a first device region Ra and a second device region Rb of the semiconductor device and extends through the passivation layer 130 and the barrier layer 110 and into at least a portion of the channel layer 108. It is important that, as shown in FIG. 10, the device isolation region 142 has a damage concentration that varies along a depth direction (the third direction D3), and a highest damage concentration Cmax of the device isolation region 142 is near a junction 109 between the barrier layer 110 and the channel layer 108.

In the following description, embodiments of the present invention are provided to illustrate that an amorphous layer or a trench may be formed in a pre-determined region of a device region of the substrate in order to reduce the stress in the epitaxial layer on the device region of the substrate, and to prevent the crack or dislocation defect from extending or propagating.

Figure 8:
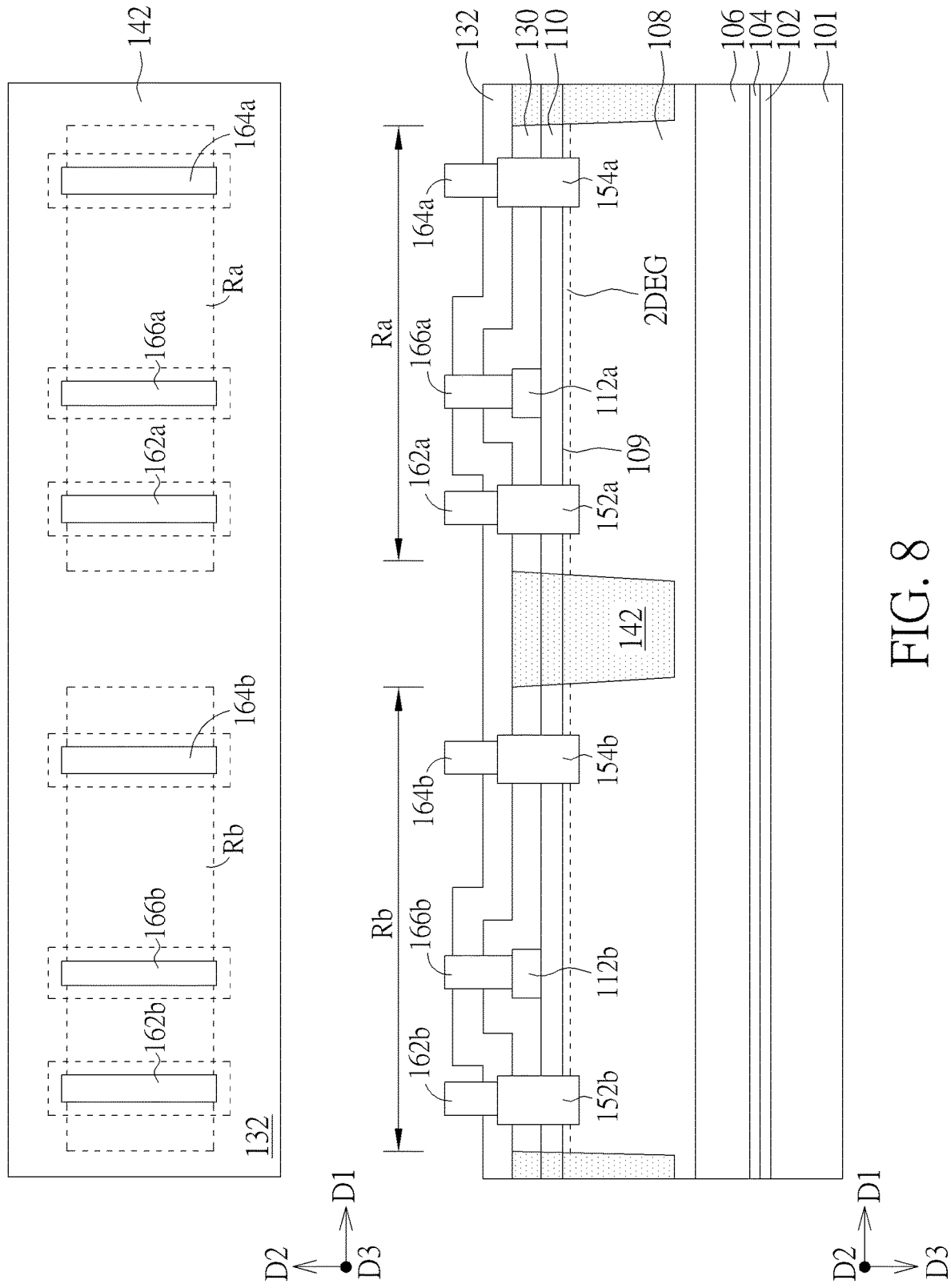
FIG. 8 is a schematic diagram illustrating a semiconductor device according to one embodiment of the present invention. The upper portion of FIG. 8 is a top view of the semiconductor device. The lower portion of FIG. 8 is a cross-sectional view of the semiconductor device.

FIG. 8 is a schematic diagram illustrating a semiconductor device according to one embodiment of the present invention. The upper portion of FIG. 8 is a top view of the semiconductor device in the plane defined by the first direction D1 and the second direction D2. The lower portion of FIG. 8 is a cross-sectional view of the semiconductor device in the plane defined by the first direction D1 and the third direction D3. The energy of the ion implantation process 140 (shown in FIG. 4) may be adjusted to make the deepest implanted ions within the thickness of the channel layer 108 and not through the channel layer 108. In this way, as shown in FIG. 8, the device isolation region 142 may extend into a portion of the thickness of the channel layer 108. The device isolation region 142 and the buffer layer 106 are not in direct contact for being separated from each other by the channel layer 108. This embodiment may be applied to the case where the concentration of the free electrons in the lower portion of the channel layer 108 is less than 1E12 count/cm$^3$.

Figure 9:
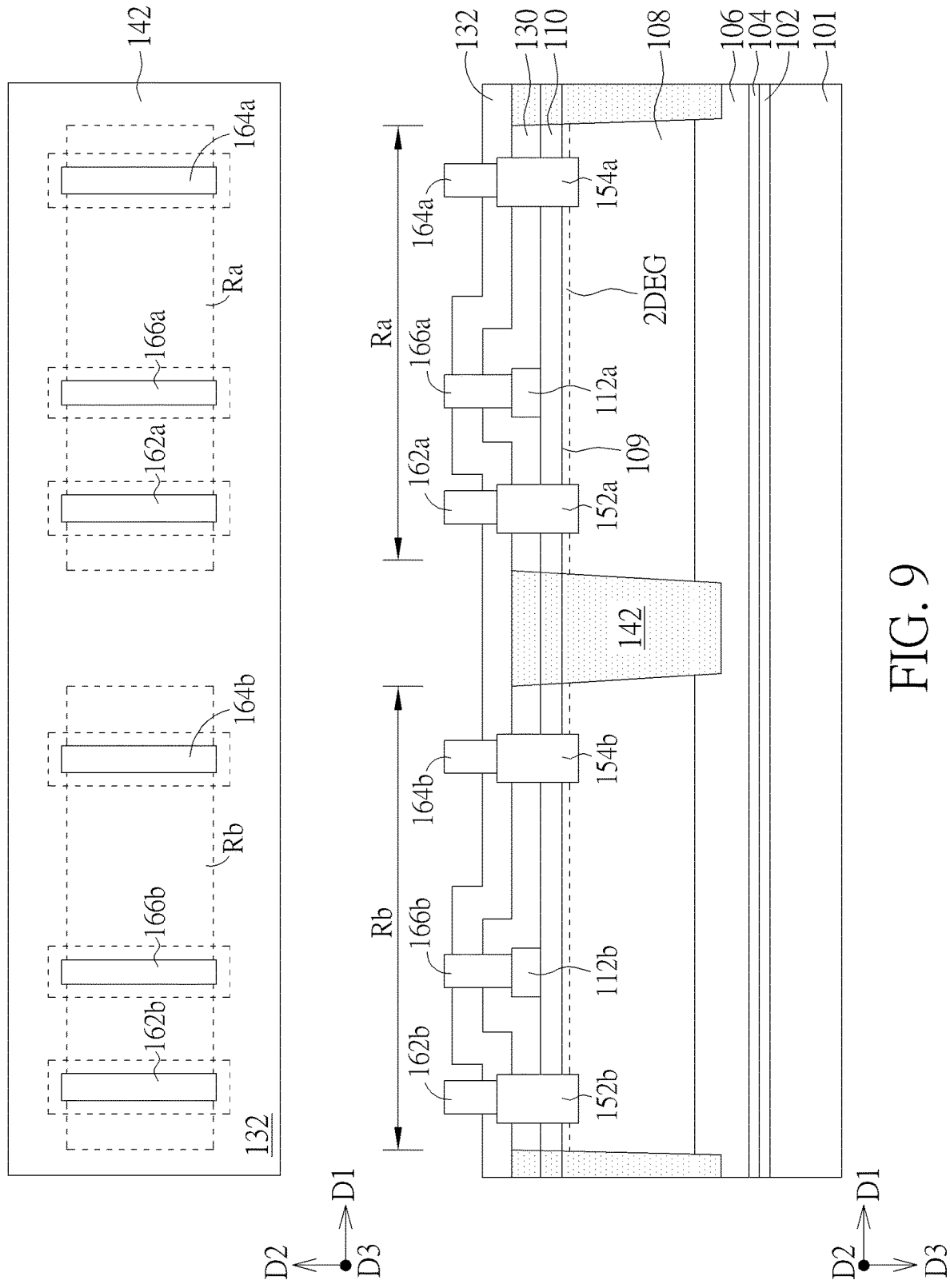
FIG. 9 is a schematic diagram illustrating a semiconductor device according to one embodiment of the present invention. The upper portion of FIG. 9 is a top view of the semiconductor device. The lower portion of FIG. 9 is a cross-sectional view of the semiconductor device.

FIG. 9 is a schematic diagram illustrating a semiconductor device according to one embodiment of the present invention. The upper portion of FIG. 9 is a top view of the semiconductor device in the plane defined by the first direction D1 and the second direction D2. The lower portion of FIG. 9 is a cross-sectional view of the semiconductor device in the plane defined by the first direction D1 and the third direction D3. The energy of the ion implantation process 140 (shown in FIG. 4) may be adjusted to make the deepest implanted ions into a portion of the buffer layer 106. Accordingly, as shown in FIG. 9, the device isolation region 142 may extend through the channel layer 108 and into a portion of the buffer layer 106.

In conclusion, the present invention provides a semiconductor device and method for forming the same, which utilize an ion implantation process to implant ions into the stacked epitaxial layers of the semiconductor device to damage the lattice structures of the stacked epitaxial layers, thereby forming a high damage concentration region in the stacked epitaxial layers. The high damage concentration region may realize the function of electrical isolation for being able to restrict or trap the free electrons so that the leakage current may be inhibited or blocked. The high damage concentration region may be used as a device isolation region of the semiconductor device, which may provide a simplified manufacturing process for being formed by ion implantation process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate;
   forming a buffer layer on the substrate;
   forming a channel layer on the buffer layer;
   forming a barrier layer on the buffer layer;
   forming a first semiconductor gate layer on the barrier layer;
   forming a passivation layer on the barrier layer and covering a top surface and sidewalls of the first semiconductor gate layer; and
   performing an ion implantation process to form a device isolation region, wherein the device isolation region encloses a first device region of the semiconductor device and extends through the passivation layer and the barrier layer and into at least a portion of the channel layer, a damage concentration of the device isolation region varies along a depth direction, and a depth range of a highest damage concentration covers a depth range of a two-dimensional electron gas layer at a junction between the barrier layer and the channel layer.

2. The method for forming a semiconductor device according to claim 1, wherein the ion implantation process implants ions into the passivation layer, the barrier layer, and at least a portion of the channel layer, wherein the ions are of at least a species selected from a group comprising argon, fluorine, nitrogen, boron, indium, and germanium.

3. The method for forming a semiconductor device according to claim 1, wherein an angle of the ion implantation process is between 0 and 10 degrees.

4. The method for forming a semiconductor device according to claim 1, wherein a dosage of the ion implantation process is between 1E12 atoms/cm$^2$ and 1E15 atoms/cm$^2$.

5. The method for forming a semiconductor device according to claim 1, further comprising:
   forming a nucleation layer on the substrate;
   forming a transition layer on the nucleation layer; and
   forming the buffer layer on the transition layer.

6. The method for forming a semiconductor device according to claim 1, wherein the device isolation region extends into a portion of the channel layer and is not in direct contact with the buffer layer.

7. The method for forming a semiconductor device according to claim 1, wherein the device isolation region extends through the channel layer and into a portion of the buffer layer.

8. The method for forming a semiconductor device according to claim 1, further comprising:
   forming a first source contact and a first drain contact at two sides of the first semiconductor gate layer, wherein the first source contact and the first drain contact extend through the passivation layer and the barrier layer and into a portion of the channel layer.

* * * * *